(12) United States Patent
Bresolin et al.

(10) Patent No.: US 8,486,743 B2
(45) Date of Patent: Jul. 16, 2013

(54) METHODS OF FORMING MEMORY CELLS

(75) Inventors: Camillo Bresolin, Vimercate (IT);
Valter Soncini, Sesto San Giovanni (IT);
Davide Erbetta, Trezzo sull'Adda (IT)

(73) Assignee: Micron Technology, Inc., Boise, ID (US)

( * ) Notice: Subject to any disclaimer, the term of this patent is extended or adjusted under 35 U.S.C. 154(b) by 65 days.

(21) Appl. No.: 13/070,169

(22) Filed: Mar. 23, 2011

(65) Prior Publication Data
US 2012/0241705 A1 Sep. 27, 2012

(51) Int. Cl.
*H01L 21/00* (2006.01)

(52) U.S. Cl.
USPC .......................................................... 438/39

(58) Field of Classification Search
None
See application file for complete search history.

(56) References Cited

U.S. PATENT DOCUMENTS

| | | |
|---|---|---|
| 4,849,247 A | 7/1989 | Scanlon et al. |
| 5,912,839 A | 6/1999 | Ovshinsky et al. |
| 6,143,670 A | 11/2000 | Cheng et al. |
| 6,664,182 B2 | 12/2003 | Jeng |
| 7,332,401 B2 | 2/2008 | Moore et al. |
| 7,935,553 B2 * | 5/2011 | Scheuerlein et al. ........... 438/39 |
| 2006/0073652 A1 | 4/2006 | Pellizzer et al. |
| 2007/0029676 A1 | 2/2007 | Takaura et al. |
| 2009/0298222 A1 | 12/2009 | Lowrey et al. |
| 2010/0001248 A1 * | 1/2010 | Wouters et al. ..................... 257/2 |
| 2010/0054029 A1 * | 3/2010 | Happ et al. ..................... 365/163 |
| 2010/0165719 A1 | 7/2010 | Pellizzer |
| 2010/0213431 A1 | 8/2010 | Yeh et al. |

FOREIGN PATENT DOCUMENTS

WO   WO 2010/073904   7/2010

OTHER PUBLICATIONS

Raoux et al., "Effect of Ion Implantation on Crystallization Properties of Phase Change Materials", presented at E\PCOS2010 Conference, Sep. 6-7, 2010, Politecnico di Milano, Milan, Italy.

* cited by examiner

*Primary Examiner* — Charles Garber
*Assistant Examiner* — Andre' C Stevenson
(74) *Attorney, Agent, or Firm* — Wells St. John P.S.

(57) ABSTRACT

Some embodiments include methods of forming memory cells. Programmable material may be formed directly adjacent another material. A dopant implant may be utilized to improve adherence of the programmable material to the other material by inducing bonding of the programmable material to the other material, and/or by scattering the programmable material and the other material across an interface between them. The memory cells may include first electrode material, first ovonic material, second electrode material, second ovonic material and third electrode material. The various electrode materials and ovonic materials may join to one another at boundary bands having ovonic materials embedded in electrode materials and vice versa; and having damage-producing implant species embedded therein. Some embodiments include ovonic material joining dielectric material along a boundary band, with the boundary band having ovonic material embedded in dielectric material and vice versa.

9 Claims, 6 Drawing Sheets

PRIOR ART

METHODS OF FORMING MEMORY CELLS

TECHNICAL FIELD

Memory cells and methods of forming memory cells.

BACKGROUND

Memory is one type of integrated circuitry, and is used in computer systems for storing data. Integrated memory is usually fabricated in one or more arrays of individual memory cells. The memory cells might be volatile, semi-volatile, or nonvolatile. Nonvolatile memory cells can store data for extended periods of time, and in some instances can store data in the absence of power. Non-volatile memory is conventionally specified to be memory having a retention time of at least about 10 years. Volatile memory dissipates, and is therefore refreshed/rewritten to maintain data storage. Volatile memory may have a retention time of milliseconds, or less.

The memory cells are configured to retain or store memory in at least two different selectable states. In a binary system, the states are considered as either a "0" or a "1". In other systems, at least some individual memory cells may be configured to store more than two levels or states of information.

Integrated circuit fabrication continues to strive to produce smaller and denser integrated circuits. There is a continuing effort to reduce the number of components in individual devices because such can reduce the size of finished constructions, and can simplify processing. The smallest and simplest memory cell will likely be comprised of two electrodes having a programmable material, and possibly a selection device (such as a diode or ovonic threshold switch), received between them.

Suitable programmable materials have two or more selectable memory states to enable storing of information by an individual memory cell. The reading of the cell comprises determination of which of the states the programmable material is in, and the writing of information to the cell comprises placing the programmable material in a predetermined state. Some programmable materials retain a memory state in the absence of refresh, and thus may be incorporated into nonvolatile memory cells.

Phase change materials, such as ovonic memory materials (for instance, various chalcogenides), are being considered for utilization as programmable materials in memory cells. The phase change materials transform from one phase to another through application of appropriate electrical stimulus, with each phase corresponding to a different memory state. The ovonic memory materials may be utilized in combination with selection devices, such as diodes or ovonic threshold switches.

Figure 1:
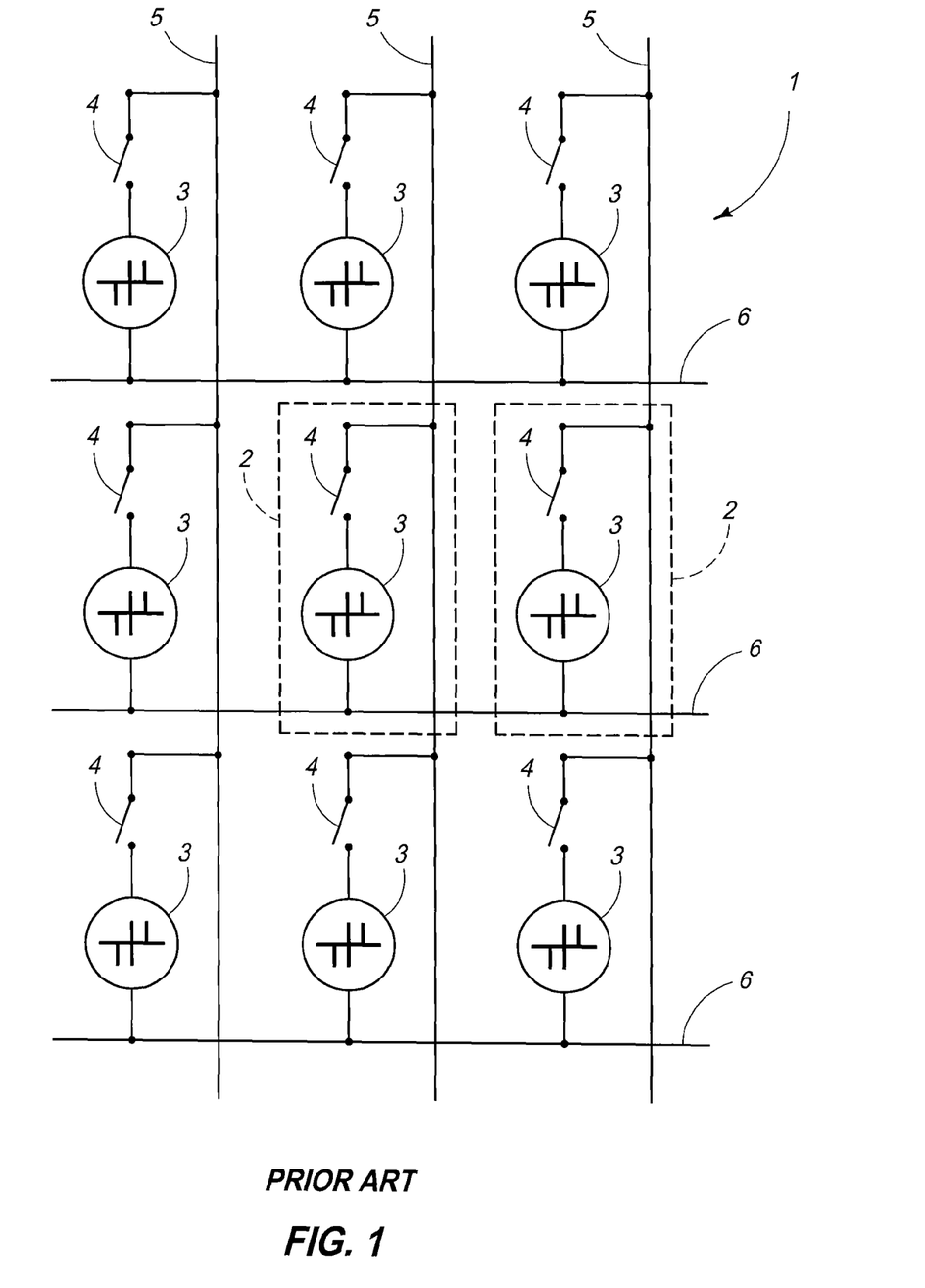
FIG. 1 schematically illustrates an example prior art memory array.

An example prior art memory array 1 comprising chalcogenic phase change memory elements is shown in FIG. 1. The memory array 1 comprises a plurality of memory cells 2, each including a memory element 3 of the phase change type and a selection device 4. The memory cells 2 are interposed at cross-points between rows 6 (also called wordlines or access lines) and columns 5 (also called bitlines or sense lines). In each memory cell 2, the memory element 3 has a first terminal connected to a wordline 6 and a second terminal connected to a selection element 4. The selection element 4 has a second terminal connected a bitline 5.

A problem that may be encountered in the utilization of ovonic materials as memory elements and/or as selection devices is that it can be difficult to adhere ovonic material to various other materials. Accordingly, delamination of ovonic material from adjacent materials may occur. Such delamination can be detrimental to memory cell performance, and in some cases may lead to failure of memory cells. It would be desirable to develop improved memory cells having better adherence of ovonic materials to adjacent materials.

DETAILED DESCRIPTION OF THE ILLUSTRATED EMBODIMENTS

In some embodiments, the invention includes methods for improving adhesion of ovonic materials to structures that are directly adjacent the ovonic materials. In some embodiments, the adjacent structures may comprise electrically conductive materials and/or dielectric materials. The methods may comprise implantation of one or more species across an interface of an ovonic material and an adjacent material to create mixing of adjacent material and ovonic material across such interface and/or to damage a crystalline lattice within one or both of the adjacent material and the ovonic material and/or to induce bonding of the ovonic material and the adjacent material across the interface. In some embodiments, the invention includes structures in which a boundary region between an ovonic material and a material directly adjacent the ovonic material comprises ovonic material embedded in the adjacent material, and vice versa. The structures may also comprise damage-producing implant species embedded in one or more of both of the ovonic material and the material directly adjacent the ovonic material.

Some embodiments may pertain to fabrication of phase change material (PCM) memory cells (for instance, an example embodiment of FIGS. 2-6), and some embodiments may pertain to fabrication of phase change material and switch (PCMS) memory cells (for instance, an example embodiment of FIGS. 7-10).

Figure 2:
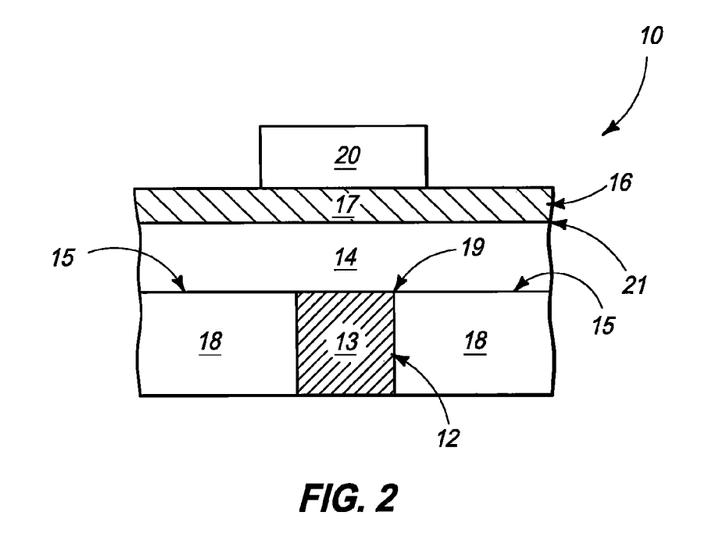
FIGS. 2-5 illustrate various stages of an example embodiment method for forming a memory cell.

Referring to FIG. 2, a construction 10 is shown to comprise a programmable material 14 sandwiched between a first electrode 12 and a second electrode 16. The first and second electrodes may be referred to as a bottom electrode and a top electrode, respectively, relative to the illustrated construction of FIG. 2. The programmable material joins with the bottom electrode 12 along a first interface 19, and joins with the top electrode 16 along a second interface 21.

The bottom electrode comprises an electrically conductive first electrode material 13, and the top electrode comprises an electrically conductive second electrode material 17. The first and second electrode materials may comprise any suitable compositions or combinations of compositions, may be the same composition as one another in some embodiments, and may differ in composition from one another in other embodiments. In some embodiments, the first and second electrode materials may comprise one or more of titanium, aluminum, carbon and tungsten. For instance, the first and second electrode materials may comprise, consist essentially of, or consist of one or more of TiSiN, TiAlN, TiN, WN, Ti, C and W; where the formulas indicate the components within the listed compounds, rather than designating specific stoichiometries of such components.

In some embodiments, the bottom electrode 12 may correspond to a "heater" utilized to thermally induce a phase change within the programmable material, and may consist essentially of or consist of, TiSiN (where the formula indicates the components within the listed compound, rather than designating a specific stoichiometry of such components).

In some embodiments, the top electrode may consist essentially of, or consist of, TiN (where the formula indicates the components within the listed compound, rather than designating a specific stoichiometry of such components).

The programmable material 14 may comprise any suitable composition or combination of compositions. The programmable material may be an ovonic memory material, and specifically may be a chalcogenide. In some embodiments, the programmable material may comprise one or more of germanium, antimony, tellurium and indium. The programmable material may, for example, comprise, consist essentially of, or consist of GeSbTe or InGeTe; where the formulas indicate the components within the listed compounds, rather than designating specific stoichiometries of such components.

The bottom electrode 12 is shown extending through electrically insulative material (i.e., dielectric material) 18. Such electrically insulative material may comprise any suitable composition or combination of compositions, and in some embodiments may comprise, consist essentially of, or consist of one or both of silicon dioxide and silicon nitride. In the shown embodiment, the programmable material joins with the dielectric material along an interface 15.

The illustrated construction may be supported by a semiconductor substrate (not shown), such as, for example, a monocrystalline silicon wafer. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above.

A mask comprising patterned masking material 20 is formed over the top electrode 16. Masking material 20 may comprise any suitable composition or combination of compositions. For instance, the masking material may correspond to a photolithographically-patterned photoresist mask and/or to a mask formed utilizing pitch-multiplication methodologies.

Figure 3:
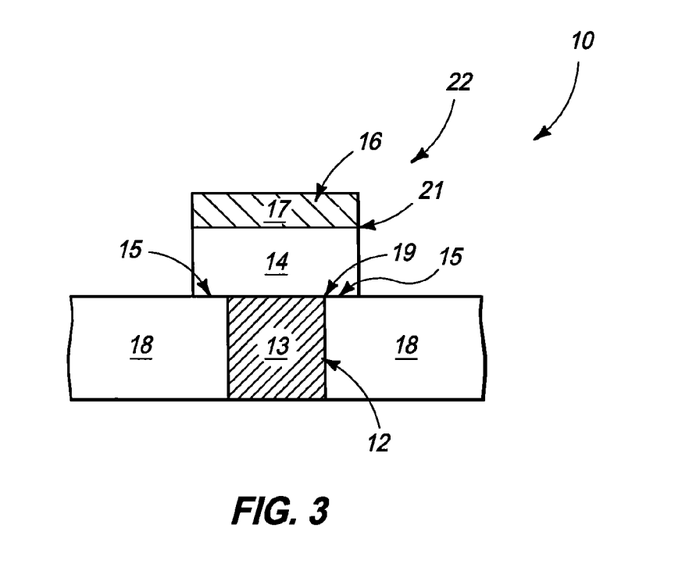

Referring to FIG. 3, a pattern is transferred from the mask of masking material 20 (FIG. 2) through the programmable material 14 and the electrode material 17, and then the masking material is removed. Such patterns a memory cell structure 22 which comprises the patterned materials 14 and 17, together with the first electrode 12. Although the bottom electrode 12 is shown to be narrower than the top electrode 16 in the memory cell structure embodiment of FIG. 3, other suitable constructions may be utilized in other embodiments.

Figure 4:
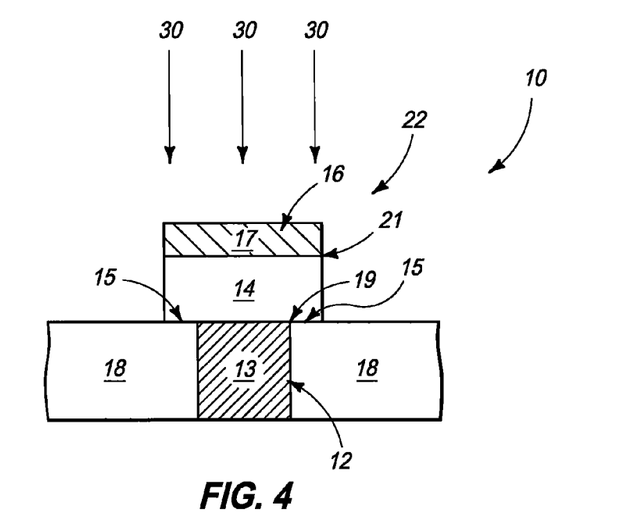

Referring to FIG. 4, dopant 30 is ion implanted into the various materials of memory cell structure 22. The dopant may be preferably targeted toward one or more of the interfaces 15, 19 and 21. The dopant may comprise any suitable dopant species, or combination of dopant species, and may be implanted to any suitable dose. In some embodiments, the dopant may comprise, consist essentially of, or consist of one or more of arsenic, boron, germanium, argon, nitrogen, antimony, indium and xenon, and may be implanted to a total dose of from about $1 \times 10^{14}$ atoms/cm$^2$ to about $1 \times 10^{16}$ atoms/cm$^2$, (such as, for example, to a dose of about $1 \times 10^{15}$ atoms/cm$^2$).

In some embodiments, the dopant may comprise an ionized molecule (for instance $BF_2^+$). In some embodiments, the dopant may comprise metal.

The dopant may improve adhesion of the programmable material to one or both of electrode materials 13 and 17, and/or may improve adhesion of the programmable material to the dielectric material 18, as described in more detail with reference to FIGS. 5 and 6. In some embodiments, the implant energy may be adjusted to obtain high dopant concentrations at desired interfaces. For instance, for atoms with atomic mass units (AMU) from 10 to 150, energy may be in the range from about 1 keV to about 1 MeV, depending on the thickness of the electrodes and ovonic materials.

Figure 5:
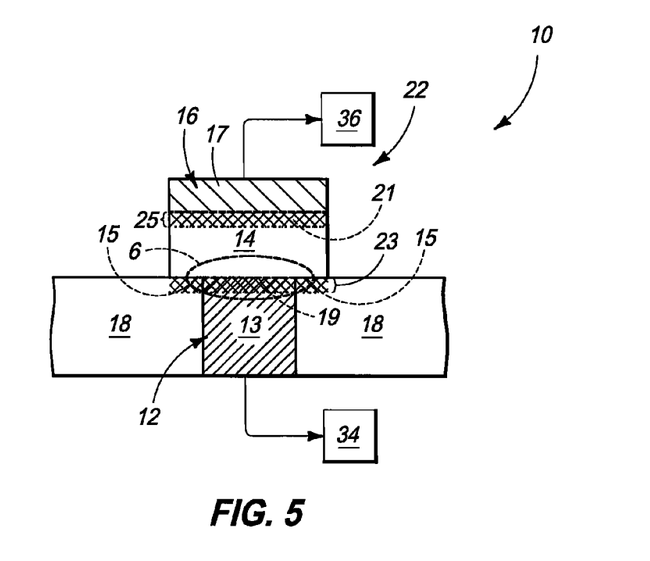

FIG. 5 shows memory cell structure 22 after the implant of dopant 30 (FIG. 4), and shows that the interfaces 19 and 21 are transformed into boundary regions 23 and 25, respectively; with such boundary regions being relatively diffuse bands as compared to the original interfaces 19 and 21. The initial locations of the interfaces 19 and 21 are shown with dashed lines in FIG. 5. The shown embodiment also has the boundary region 23 extending across the interface 15. The boundary region 25 may have the electrically conductive material 17 intermixed with ovonic material 14, and/or may have enhanced bonding between the materials 14 and 17. The portion of the boundary region 23 across the interface 19 may have the electrically conductive material 13 intermixed with ovonic material 14 and/or may have enhanced bonding between the materials 13 and 14; and the portion of the boundary region 23 across the interface 15 may have the dielectric material 18 intermixed with the ovonic material 14 and/or may have enhanced bonding between the materials 14 and 18.

Figure 6:
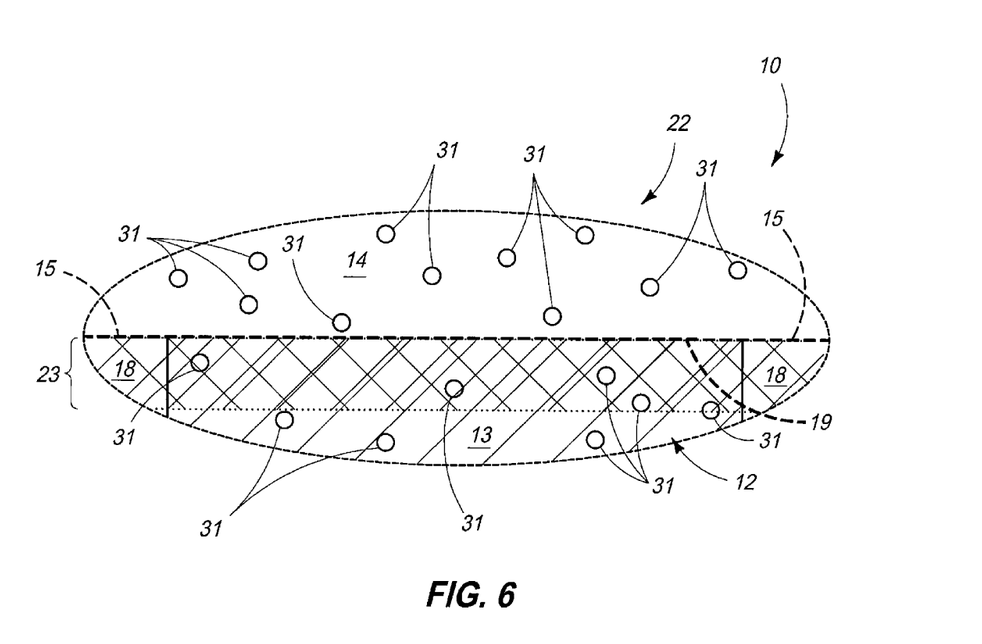
FIG. 6 illustrates an expanded region of the memory cell of FIG. 5.

FIG. 6 shows an expanded view of the boundary region 23. The dopant 30 (FIG. 4) may impart damage to the electrode material 13 and the programmable material 14 such that intermixing of the electrode material 13 and the programmable material 14 occurs adjacent the initial interface 19, and may also induce intermixing of the dielectric material 18 and the programmable material 14 adjacent the initial interface 15. The intermixing may be due to a "knock-on" effect and can be simulated by computer codes. The intermixing may be detected by any suitable analytical technique, such as, for example, secondary ion mass spectroscopy.

Alternatively to, or in addition to, causing the intermixing, the implanted dopant may destroy some chemical bonds along the interfaces and within the bulk materials. Bonding may be subsequently reconstructed along the interfaces (in some embodiments the reconstruction may be enhanced by subsequent thermal annealing), and the reconstructed bonding may include enhanced bonding between the various materials (i.e., across the interfaces) which may also improve adhesion of the materials to one another. In other words, the combination of the bond-breaking implant and the subsequent thermal annealing may increase an amount of bonding between the programmable material and another material directly adjacent such programmable material, relative to an amount of the bonding that existed between the programmable material and the adjacent material prior to the implant and thermal anneal. The thermal anneal may utilize any suitable processing, such as, for example, a temperature of at least about 350° C. for a duration of at least about 10 minutes. In some embodiments, the thermal anneal may be conducted at a temperature of less than or equal to about 400° C.

The damage induced by dopant 30 (FIG. 4) may include generation of dangling bonds and/or the alteration of crystallinity within one or more of the programmable material 14, the dielectric material 18, and the electrode material 13. For instance, one or both of the programmable material and the electrode material may have a crystallinity along the initial interface 19 and may have an initial concentration of dangling bonds (which may be about 0 in some embodiments). The crystallinity may be reduced by the impacting dopant and/or the concentration of dangling bonds may be increased. As another example, one or both of the programmable material and the dielectric material may have a crystallinity along the initial interface 15, and may have an initial concentration of dangling bonds. The crystallinity may be reduced by the impacting dopant and/or the concentration of dangling bonds may be increased.

Reduced crystallinity within the various materials may be detected by any suitable technology, including, for example, measurement of x-ray diffraction. If the change in crystallinity occurs in the electrode material or the dielectric material, such change may remain in the memory cell after multiple read/write cycles. In contrast, if the change in crystallinity occurs in the programmable material, such change may essentially disappear after a couple of read/write cycles since such read/write cycles may comprise alteration of the phase of programmable material between crystalline and amorphous phases.

Increased concentrations of dangling bonds along the various interfaces may improve adhesion of materials along the interfaces if the dangling bonds subsequently recombine to form bonds extending across the interfaces. Such recombination may be induced by thermal annealing (such as thermal treatment at a temperature of about 350° C.) in some embodiments.

Atoms of the damage-producing implant species of dopant 30 (FIG. 4) may remain within the boundary region 23, electrode material 13, dielectric material 18, and programmable material 14; and such atoms are diagrammatically illustrated in FIG. 6 as particles 31.

The intermixing of programmable material 14 and electrode material 13 within boundary region 23, and/or reconstruction of bonds across an interface of the programmable material and the electrode material, and/or the recovery of implant-induced dangling bonds, may improve adhesion of the programmable material to the electrode material (for instance, it may improve atomic bonding between the two materials), and may thereby alleviate or prevent the delamination problems discussed above in the "Background" section of this disclosure. Similarly, adhesion of the programmable material 14 to the dielectric material 18 may be analogously improved, and adhesion of the programmable material 14 to the electrode material 17 may be improved.

The embodiment of FIGS. 2-6 utilizes a dopant implant occurring at a processing stage subsequent to formation of both the programmable material 14 and the top electrode material 17. Accordingly, such embodiment simultaneously implants dopant into both of the interfaces 19 and 21 (FIG. 4). In some embodiments, it may be desired to only implant dopant into the bottom interface 19. The damaging implant may be performed prior to formation of the top electrode material 17 in such embodiments. In some embodiments, implant conditions (species, dose and energy) may be chosen to direct most of the damaging effects to one interface more than all the others. Also, although the implant is shown occurring after patterning materials 14 and 17 into a memory cell structure, in other embodiments the damaging implant may be conducted prior to the patterning of the materials. It may be particularly advantageous to conduct the damaging implant, and thereby improve adhesion of the ovonic material to adjacent materials, prior to patterning in embodiments in which layer lift-off may otherwise be problematic during the patterning.

The memory cell structure 22 of FIG. 5 may be one of a large number of identical memory cell structures that are simultaneously fabricated. Such memory cell structures may be incorporated into a memory array by electrically connecting them to access lines and sense lines. For instance, the memory cell structure 22 may be incorporated into a memory array by electrically interconnecting the bottom electrode 12 with an access line (i.e., wordline) 34, and electrically interconnecting the top electrode 16 with a sense line (i.e., bitline) 36. A select device (not shown) such as a diode or ovonic threshold switch (OTS) may be provided between either the bottom electrode and the access line, or between the top electrode and the bitline.

FIGS. 7-10 illustrate an example embodiment method in which an OTS is fabricated as part of a memory cell structure.

Figure 7:
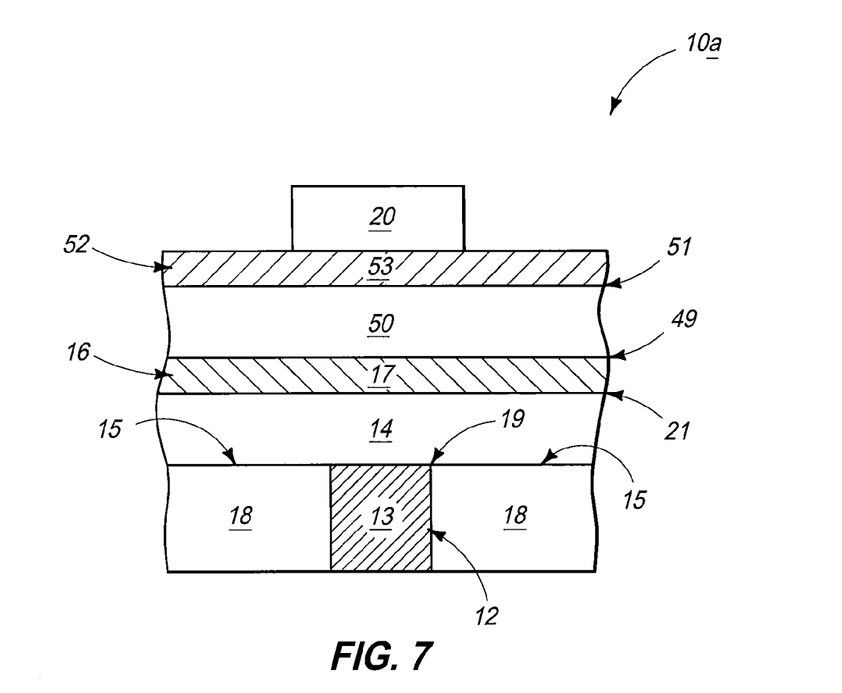
FIGS. 7-10 illustrate various stages of another example embodiment method for forming a memory cell.

Referring to FIG. 7, a construction 10a comprises the first electrode 12, programmable material 14, and second electrode 16. The construction also comprises OTS material 50 over the second electrode 17, and a third electrode 52 over the OTS material. In some embodiments, the construction 10a may be considered to comprise two ovonic materials 14 and 50, with one of the ovonic materials being an ovonic memory material, and the other being OTS material. Although the shown embodiment implies that the memory material is formed before the OTS material, in other embodiments the construction could be reversed so that the OTS material is formed before the memory material.

The first interface 19 is between the programmable material 14 and the first electrode 12, and the second interface 21 is between the programmable material and the second electrode 16. A third interface 49 is between the OTS material 50 and the second electrode 16, and a fourth interface 51 is between the OTS material and the third electrode 52. Additionally, the interface 15 is between the programmable material and the dielectric material 18.

The structure 16 is utilized differently in the configuration of FIG. 7 than in the configuration of FIG. 2. Specifically, the structure 16 is an uppermost electrode in the embodiment of FIG. 2, and is a conductive link between OTS material 50 and programmable material 14 in the embodiment of FIG. 7. The structure 16 may be appropriately referred to as an "electrode" in both the configuration of FIG. 2 and the configuration of FIG. 7. Alternatively, the structure 16 may be referred to as a barrier in the configuration of FIG. 7.

Structure 16 may comprise any suitable composition or combination of compositions in the construction of FIG. 7; and in some embodiments may comprise, consist essentially of or consist of TiAlN (where the formula indicates the components within the listed compound, rather than designating a specific stoichiometry of such components) and/or carbon.

The OTS material 50 may comprise any suitable composition or combination of compositions; and in some embodiments may comprise, consist essentially of, or consist of one or more of germanium, arsenic, selenium, tellurium and silicon. The OTS material may, for example, comprise, consist essentially of, or consist of AsSe, AsSeGe, AsSeGeTe or AsGeTeSi; where the formulas indicate the components within the listed compounds, rather than designating specific stoichiometries of such components.

The electrode 52 comprises an electrode material 53. Such electrode material may comprise any suitable composition or combination of compositions; and may, for example, comprise one or more of titanium, aluminum, carbon and tungsten.

The patterned masking material 20 is shown formed over electrode 52.

Figure 8:
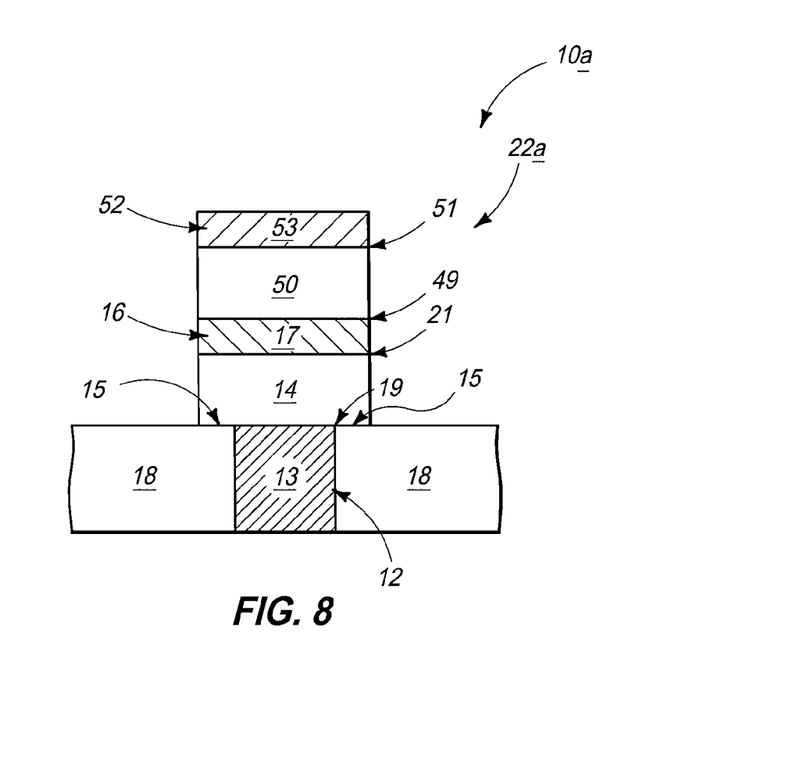

Referring to FIG. 8, a pattern is transferred from the mask of masking material 20 (FIG. 7) through the programmable material 14, electrode material 17, OTS material 50 and electrode material 53, and then the masking material is removed. Such patterns a memory cell structure 22a. The memory cell structure 22a includes the patterned materials 14, 17, 50 and 53, and also includes the first electrode 12.

Figure 9:
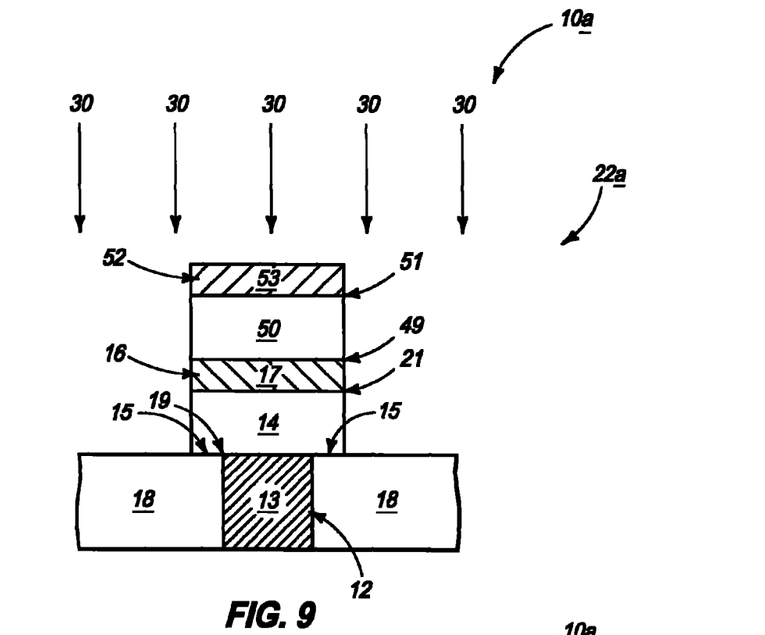

Referring to FIG. 9, dopant 30 is implanted into the various materials of memory cell structure 22a. The damaging implant may be preferably targeted toward one or more of the interfaces 15, 19, 21, 49 and 51. The dopant may comprise any suitable dopant species, or combination of dopants species, and may be implanted to any suitable dose and energy. In some embodiments, the dopant may comprise any of the species discussed above with reference to FIG. 4, and may be implanted to a total dose of from about $1 \times 10^{14}$ atoms/cm$^2$ to about $1 \times 10^{16}$ atoms/cm$^2$, (such as, for example, to a dose of about $1 \times 10^{15}$ atoms/cm$^2$), and may be implanted at an energy of from about 1 keV to about 1 MeV (such as, for example, 100 keV in the case of arsenic).

The dopant improves adhesion of the ovonic materials across one or more of the interfaces 15, 19, 21, 49 and 51 analogous to the improved adhesion described above with reference to FIG. 6.

Figure 10:
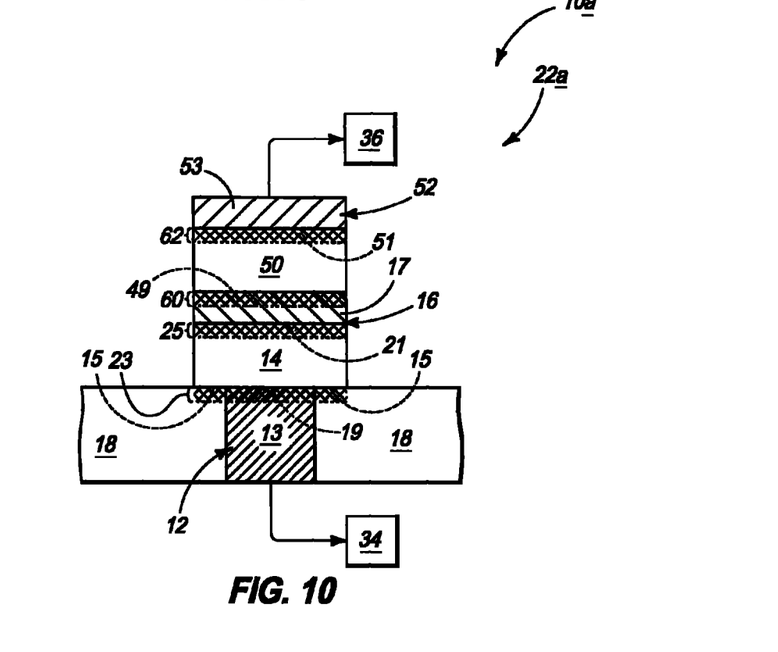

FIG. 10 shows memory cell structure 22a after the implant of dopant 30 (FIG. 9), and shows that the interfaces 15, 19, 21, 49 and 51 are transformed into boundary regions 23, 25, 60 and 62; with such boundary regions being relatively diffuse bands as compared to the original interfaces 15, 19, 21, 49 and 51. The initial locations of the interfaces 15, 19, 21, 49 and 51 are shown with dashed lines in FIG. 10.

The dopant 30 (FIG. 9) imparts damage to the various electrode materials (13, 17 and 53), the dielectric material 18, and the ovonic materials (14 and 50) such that the electrode materials and ovonic materials may intermix with one another within the boundary regions 23, 25, 60 and 62 (analogous to the intermixing discussed above with reference to FIGS. 5 and 6); and the dielectric material and ovonic material may also intermix along the boundary region 23. Alternatively, or additionally, there may be recovery (i.e., reconstruction) of implant-induced broken bonds to enhance bonding across one or more of the interfaces 15, 19, 21, 49 and 51 analogous to the bond reconstruction discussed above with reference to FIG. 6; formation of dangling bonds followed by an appropriate anneal; and/or alteration of crystalline structure within one or more of the materials exposed to the damage-inducing implant. The effects caused by the damaging implant may improve adhesion of the ovonic materials to the adjacent materials (analogous to improved adhesion discussed above with reference to FIG. 6), and may thereby alleviate or prevent the delamination problems discussed above in the "Background" section of this disclosure.

Atoms of the damage-producing implant species of dopant 30 may remain within the various boundary regions, as discussed above with reference to the boundary region 23 of FIG. 6. Also, atoms from upper components of structure 10a may be displaced into underlying components. For instance, atoms from electrode material 53 may displaced into the bulk OTS material 50. The concentration of such displaced atoms inside the OTS due to implant knock-on may be simulated by a computer code and measured by any suitable material analysis technique, such as Secondary Ion Mass Spectroscopy (SIMS). Analogously, displaced atoms may cross other interfaces of structure 10a, and may be simulated and detected.

The embodiment of FIGS. 7-10 utilizes a dopant implant occurring at a processing stage subsequent to formation of the memory ovonic material, OTS material, and the electrodes 16 and 52. Accordingly, such embodiment simultaneously implants dopant into all of the interfaces 15, 19, 21, 49 and 51 (FIG. 9). In some embodiments, it may be desired to implant dopant selectively into one or more of the interfaces. In such embodiments, one or more dopant implants may be performed at one or more intermediate stages during formation of the stack of materials 14, 17, 50 and 53 of FIG. 7, rather than after formation of the entire stack. In some embodiments, one or more of the dopant implants may be conducted prior to patterning one or more of the materials into a memory cell configuration.

The memory cell structure 22a of FIG. 10 may be one of a large number of identical memory cell structures that are simultaneously fabricated. Such memory cell structures may be incorporated into a memory array by electrically connecting them to access lines and sense lines. For instance, the memory cell structure 22a may be incorporated into a memory array by electrically interconnecting the bottom electrode 12 with an access line (i.e., wordline) 34, and electrically interconnecting the uppermost electrode 52 with a sense line (i.e., bitline) 36.

The memory cells and arrays discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a memory cell, comprising:
   forming a programmable material directly against another material, the programmable material joining said other material along an interface; one or both of the programmable material and the other material having a crystallinity along said interface, and having a first concentration of dangling bonds along said interface; and
   implanting a dopant species simultaneously into both the programmable material and the other material to alter the crystallinity of one or both of the other material and the programmable material along said interface, and/or to increase a concentration of dangling bonds along the interface.

2. The method of claim 1 wherein the implanting the dopant alters the crystallinity within one or both of the other material and the programmable material along said interface.

3. The method of claim 1 wherein the implanting the dopant increases a concentration of dangling bonds along said interface.

4. The method of claim 1 wherein the other material is an electrically insulative material.

5. The method of claim 1 wherein the other material is an electrically conductive electrode material.

6. The method of claim 5 wherein the electrode material comprises one or more of TiSiN, TiAlN, TiN, WN, Ti, C and W; where the formulas indicate the components within the listed compounds, rather than designating specific stoichiometries of such components.

7. The method of claim 1 wherein the programmable material comprises one or more of germanium, antimony, tellurium and indium.

8. The method of claim 1 wherein the dopant comprises one or more of arsenic, boron, germanium, argon, nitrogen, antimony, indium and xenon.

9. The method of claim 1 wherein the dopant comprises metal.

* * * * *